US008410508B1

(12) United States Patent
Yen et al.

(10) Patent No.: US 8,410,508 B1
(45) Date of Patent: Apr. 2, 2013

(54) LIGHT EMITTING DIODE (LED) PACKAGE HAVING WAVELENGTH CONVERSION MEMBER AND WAFER LEVEL FABRICATION METHOD

(75) Inventors: Jui- Kang Yen, Taipei (TW); Trung Tri Doan, Baoshan Hsinchu (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 0 days.

(21) Appl. No.: 13/229,836

(22) Filed: Sep. 12, 2011

(51) Int. Cl.
*H01L 33/00* (2010.01)
*H01L 31/111* (2006.01)
*H01L 31/101* (2006.01)

(52) U.S. Cl. ............ 257/98; 257/99; 257/100; 257/116; 257/117

(58) Field of Classification Search ............... 257/81–82, 257/91, 98–100, 116–117, 432–437, 749; 438/25–35
See application file for complete search history.

(56) References Cited

U.S. PATENT DOCUMENTS

| | | | |
|---|---|---|---|
| 5,959,316 A * | 9/1999 | Lowery ........................... | 257/98 |
| 5,998,925 A | 12/1999 | Shimizu et al. | |
| 6,351,069 B1 | 2/2002 | Lowery et al. | |
| 6,504,181 B2 | 1/2003 | Furukawa et al. | |
| 6,576,488 B2 | 6/2003 | Collins, III et al. | |
| 6,642,652 B2 | 11/2003 | Collins, III et al. | |
| 6,744,196 B1 | 6/2004 | Jeon | |
| 7,045,956 B2 | 5/2006 | Braune et al. | |
| 7,138,660 B2 * | 11/2006 | Ota et al. ......................... | 257/79 |
| 7,195,944 B2 | 3/2007 | Tran et al. | |
| 7,361,938 B2 | 4/2008 | Mueller et al. | |
| 7,432,119 B2 | 10/2008 | Doan | |
| 7,615,789 B2 | 11/2009 | Tran | |
| 7,646,033 B2 | 1/2010 | Tran et al. | |
| 7,737,459 B2 | 6/2010 | Edmond et al. | |
| 7,781,783 B2 * | 8/2010 | Yen et al. ......................... | 257/89 |
| 7,804,103 B1 * | 9/2010 | Zhai et al. ....................... | 257/98 |
| 7,824,941 B2 | 11/2010 | Braune et al. | |
| 8,012,774 B2 | 9/2011 | Tran et al. | |
| 2002/0076904 A1 | 6/2002 | Imler | |
| 2002/0089058 A1 | 7/2002 | Hedler et al. | |
| 2002/0185965 A1 | 12/2002 | Collins et al. | |
| 2004/0077114 A1 | 4/2004 | Coman et al. | |
| 2004/0245543 A1 | 12/2004 | Yoo | |
| 2005/0173692 A1 | 8/2005 | Park et al. | |

(Continued)

FOREIGN PATENT DOCUMENTS

WO    WO 2004040661    5/2004

OTHER PUBLICATIONS

Edward D. Cohen, "Choosing the Coating Method", Modern Coating and Drying Technology, date unavailable, pp. 1-20, (1992).

*Primary Examiner* — Long Tran
*Assistant Examiner* — Dzung Tran
(74) *Attorney, Agent, or Firm* — Stephen A. Gratton

(57) ABSTRACT

A light emitting diode (LED) package includes a substrate and a light emitting diode (LED) die on the substrate configured to emit electromagnetic radiation in a first spectral region. The (LED) package also includes a dielectric layer on the (LED) die and a wavelength conversion member on the dielectric layer configured to convert the electromagnetic radiation in the first spectral region to electromagnetic radiation in a second spectral region. The (LED) package also includes an interconnect comprising a conductive trace on the wavelength conversion member and on the dielectric layer in electrical contact with a die contact on the (LED) die and with a conductor on the substrate, and a transparent dome configured as a lens encapsulating the (LED) die.

22 Claims, 8 Drawing Sheets

U.S. PATENT DOCUMENTS

| | | |
|---|---|---|
| 2006/0003477 A1 | 1/2006 | Braune et al. |
| 2006/0061259 A1 | 3/2006 | Negley |
| 2007/0267646 A1 | 11/2007 | Wierer, Jr. et al. |
| 2008/0099770 A1* | 5/2008 | Mendendorp et al. ......... 257/79 |
| 2009/0065791 A1* | 3/2009 | Yen et al. ....................... 257/98 |
| 2009/0236625 A1* | 9/2009 | Yen et al. ....................... 257/99 |
| 2009/0273918 A1 | 11/2009 | Falicoff et al. |
| 2010/0165599 A1 | 7/2010 | Allen |
| 2010/0308361 A1* | 12/2010 | Beeson et al. ................. 257/98 |
| 2011/0111537 A1* | 5/2011 | Cheng et al. .................. 438/26 |

* cited by examiner

LIGHT EMITTING DIODE (LED) PACKAGE HAVING WAVELENGTH CONVERSION MEMBER AND WAFER LEVEL FABRICATION METHOD

BACKGROUND

This disclosure relates generally to light emitting diodes (LED) devices and more particularly to methods for fabricating light emitting diode (LED) packages.

Light emitting diode (LED) devices have been developed that produce white light. In order to produce white light, a blue (LED) die can be used in combination with a wavelength conversion layer, such as a phosphor layer formed on the surface of the die. The electromagnetic radiation emitted by the blue (LED) die excites the atoms of the wavelength conversion layer, which converts some of the electromagnetic radiation in the blue wavelength spectral region to the yellow wavelength spectral region. The ratio of the blue to the yellow can be manipulated by the composition and geometry of the wavelength conversion layer, such that the output of the light emitting diode (LED) device appears to be white light.

In this type of light emitting diode (LED) device, the characteristics of the white light produced by the device are determined by the electromagnetic radiation emitted by the blue LED die and by the wavelength conversion properties of the wavelength conversion layer. For example, the color composite of the white light depends upon the spectral distributions of electromagnetic radiation produced by the blue LED die and the wavelength conversion layer. Any variations in these spectral distributions can vary the color composite of the white light produced by the light emitting diode (LED) device. Because of the variations in the configurations of the blue LED die and the wavelength conversion layer, the white light can have an undesirable color balance and lack the characteristics of a true color rendition.

It is difficult to fabricate white light emitting diode (LED) devices with consistent color balance because any variations in the fabrication process can change the outputs of the light emitting diode (LED) dice and the wavelength conversion layers. The present disclosure is directed to a wafer level method for fabricating light emitting diode (LED) devices with consistent characteristics. For example, using the method a light emitting diode (LED) device can be fabricated that produces electromagnetic radiation in the form of white light having a desired color balance, a desired color temperature or a desired spectral distribution. The present disclosure is also directed to a light emitting diode (LED) device having a wavelength conversion member in the form of a sheet having conductive vias therethrough.

SUMMARY

A light emitting diode (LED) package includes a substrate and a light emitting diode (LED) die on the substrate configured to emit electromagnetic radiation in a first spectral region. The (LED) package also includes a dielectric layer on the (LED) die and a wavelength conversion member on the dielectric layer configured to convert the electromagnetic radiation in the first spectral region to electromagnetic radiation in a second spectral region. The (LED) package also includes an interconnect comprising a conductive trace on the wavelength conversion member and on the dielectric layer in electrical contact with a die contact on the (LED) die and with a conductor on the substrate, and a transparent dome configured as a lens encapsulating the (LED) die.

A method for fabricating the light emitting diode (LED) package includes the steps of providing a substrate, attaching a light emitting diode (LED) die to the substrate configured to emit electromagnetic radiation in a first spectral region, and forming a dielectric layer on the (LED) die and the substrate. The method also includes the steps of forming a wavelength conversion member configured to convert the electromagnetic radiation in the first spectral region to electromagnetic radiation in a second spectral region, attaching the wavelength conversion member to the dielectric layer, forming an interconnect comprising a conductive trace on the wavelength conversion member and on the dielectric layer having a first conductive via in the wavelength conversion member in electrical contact with a die contact on the (LED) die and a second conductive via in the dielectric layer in electrical contact with a conductor on the substrate, and forming a transparent dome configured as a lens encapsulating the (LED) die. The method can be performed on a semiconductor wafer containing multiple light emitting diode (LED) dice having multiple metallization patterns, which decreases fabrication time and costs

BRIEF DESCRIPTION OF THE DRAWINGS

Exemplary embodiments are illustrated in the referenced figures of the drawings. It is intended that the embodiments and the figures disclosed herein are to be considered illustrative rather than limiting.

DETAILED DESCRIPTION

Figure 1A:
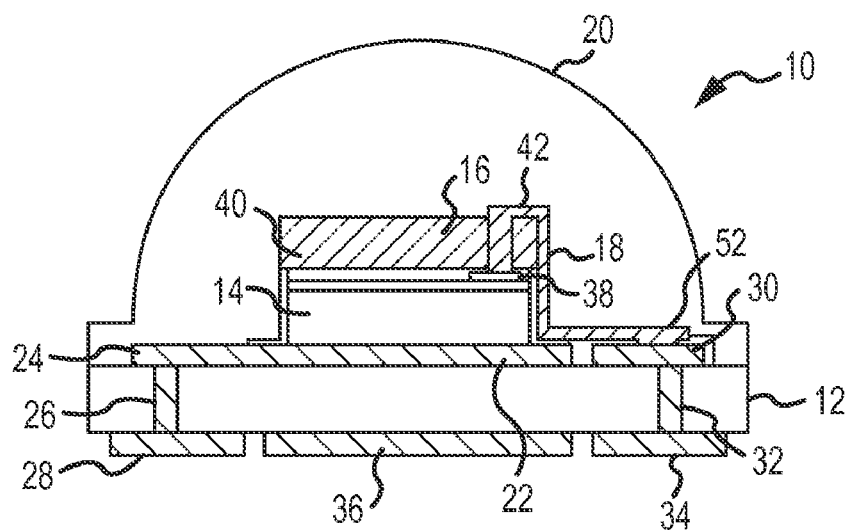
FIG. 1A is a schematic cross sectional view of a light emitting diode (LED) package.
Figure 1B:
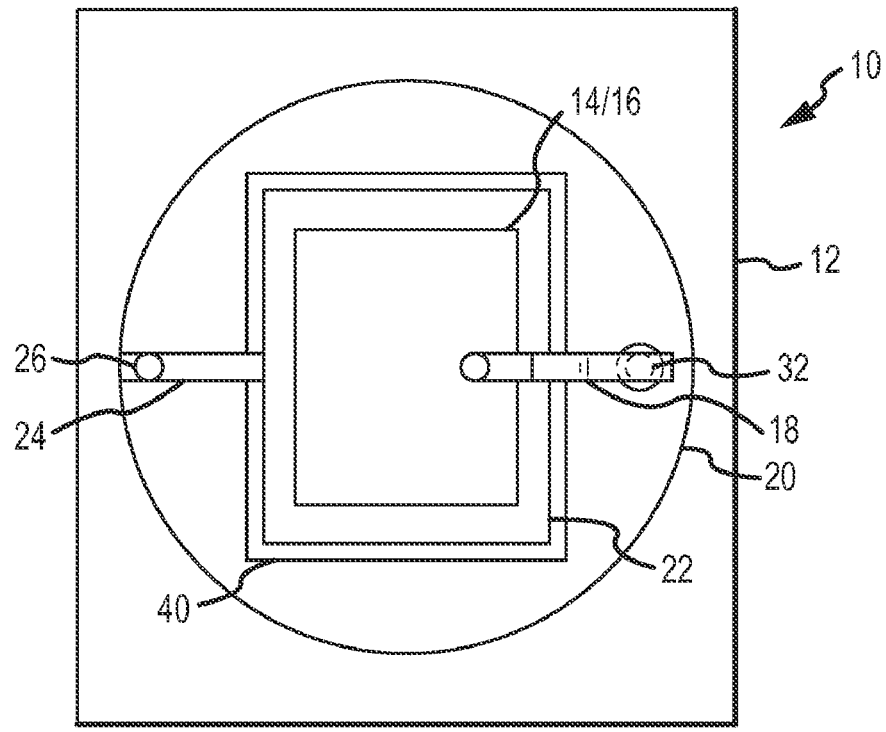
FIG. 1B is a schematic plan view of the light emitting diode (LED) package.

Referring to FIGS. 1A and 1B, a light emitting diode (LED) package 10 is illustrated. The light emitting diode (LED) package 10 includes a substrate 12; at least one light emitting diode (LED) die 14 mounted to the substrate 12; a wavelength conversion member 16 on the (LED) die 14; an interconnect 18 comprising a metal trace on the wavelength conversion layer, on the (LED) die 14 and on the substrate 12; and a transparent dome 20 configured as a lens encapsulating the light emitting diode (LED) die 10.

The substrate 12 (FIGS. 1A and 1B) includes a die-mounting pad 22 on a front side thereof (first side in the claims). A backside of the (LED) die 14 is electrically connected to the die-mounting pad 22 using a conductive material such as a solder or conductive adhesive layer. The substrate 12 also includes a front side conductor 24 in electrical communication with the die mounting pad 22, a conductive via 26 in electrical communication with the front side conductor 24, and a back side electrode 28 on the back side thereof (second side in the claims) in electrical communication with the conductive via 26. The substrate 12 also includes a front side conductor 30 in electrical communication with the interconnect 18, a conductive via 32 in electrical communication with the front side conductor 30, and a back side electrode 34 in electrical communication with the conductive via 32. The back side electrodes 28, 34 are configured for electrical connection to a mother board, circuit board or other support substrate (not shown) for mounting and electrically connecting the light emitting diode (LED) package 10 in a LED system.

The substrate 12 can also include additional circuit elements as required, such as a backside heat sink 36 (FIG. 1A). In addition, the substrate 12 (FIGS. 1A and 1B) can have a flat cross sectional shape as shown or can have a convex cross sectional shape or a concave cross sectional shape. In addition, the substrate 12 can include a reflective layer (not shown) to improve light extraction. The substrate 12 preferably comprises Si, $Al_2O_3$ or AlN. However the substrate 12 can comprise another semiconductor material such as GaAs, SiC, GaP, GaN, a ceramic material, sapphire, glass, a printed circuit board (PCB) material, a metal core printed circuit board (MCPCB), an FR-4 printed circuit board (PCB), a metal matrix composite, a metal lead frame, an organic lead frame, a silicon submount substrate, or any packaging substrate used in the art. Further, the substrate 12 can comprise a single layer of metal or metal alloyed layers, or multiple layers such as Si, AlN, SiC, AlSiC, diamond, MMC, graphite, Al, Cu, Ni, Fe, Mo, CuW, CuMo, copper oxide, sapphire, glass, ceramic, metal or metal alloy. In any case, the substrate 12 preferably has an operating temperature range of from about 60° C. to 350° C.

In addition, the substrate 12 (FIGS. 1A and 1B) can have any polygonal footprint (e.g., square, rectangular) and any suitable size. For example, the substrate 12 can be die-sized, such that the light emitting diode (LED) package 10 has a chip scale size similar to that of a chip scale package (CSP). Alternately, the substrate 12 can be wafer sized such that a wafer scale system with a plurality of light emitting diode (LED) dice 14 is provided. Further, the substrate 12 can have a desired thickness, with from 35 μm to 3000 μm being representative.

The light emitting diode (LED) die 14 (FIGS. 1A and 1B) is electrically mounted to the die mounting pad 22 (FIG. 1A) and includes a die contact 38 (FIG. 1A) in electrical communication with the interconnect 18. The (LED) die 14 can comprise a conventional LED device fabricated using known processes. For example, the (LED) die 14 can comprise a vertical light emitting diode (VLED) die formed at the wafer level using processes disclosed in U.S. Pat. No. 7,195,944 B2 to Tran et al., and U.S. Pat. No. 7,615,789 B2 to Tran, both of which are incorporated herein by reference. The (LED) die 14 can also be provided by a manufacturer such as Semileds Corporation of Boise, Id. and Hsinchu County, Taiwan, R.O.C.

In addition, the (LED) die 14 (FIGS. 1A and 1B) can be configured to emit electromagnetic radiation having desired characteristics, such as electromagnetic radiation in a desired spectral region. For example, the (LED) die 14 can be configured to emit electromagnetic radiation from the visible spectral region (e.g., 400-770 nm), the violet-indigo spectral region (e.g., 400-450 nm), the blue spectral region (e.g., 450-490 nm), the green spectral region (e.g., 490-560 nm), the yellow spectral region (e.g., 560-590 nm), the orange spectral region (e.g., 590-635 nm) or the red spectral region (e.g., 635-700 nm).

As shown in FIG. 1A, the light emitting diode (LED) package 10 also includes a dielectric layer 40 located between the (LED) die 14 and the wavelength conversion member 16 that also covers the sidewalls of the (LED) die 14 and portions of the surface of the substrate 12. Preferred materials for the dielectric layer 40 include polymers such as silicone, epoxy and adhesives (glue). The wavelength conversion member 16 is attached to the dielectric layer 40 and can have a peripheral shape that substantially matches that of the (LED) die 14. In addition, the interconnect 18 includes a first conductive via 42 in the wavelength conversion member 16 in electrical contact with the die contact 38 on the (LED) die 14. The interconnect 18 also includes a second conductive via 52 in the dielectric layer 40 in electrical contact with the interconnect 18 and with the conductor 30 on the substrate 12.

The wavelength conversion member 16 (FIG. 1A) includes a material configured to convert at least some of the electromagnetic radiation emitted by the (LED) die 14 into electromagnetic radiation having a different wavelength range. For example, the wavelength conversion member 16 can include a layer of material configured to convert the electromagnetic radiation emitted by the (LED) die 14 into electromagnetic radiation having a higher wavelength. For example, if the (LED) die 14 emits electromagnetic radiation in a blue spectral range, the wavelength conversion member 16 can include a layer containing a phosphor compound for converting some of this radiation to a yellow spectral range. Suitable phosphor compounds are known in the art and further described in the previously cited patents to Tran et al. and Tran.

Figure 2:
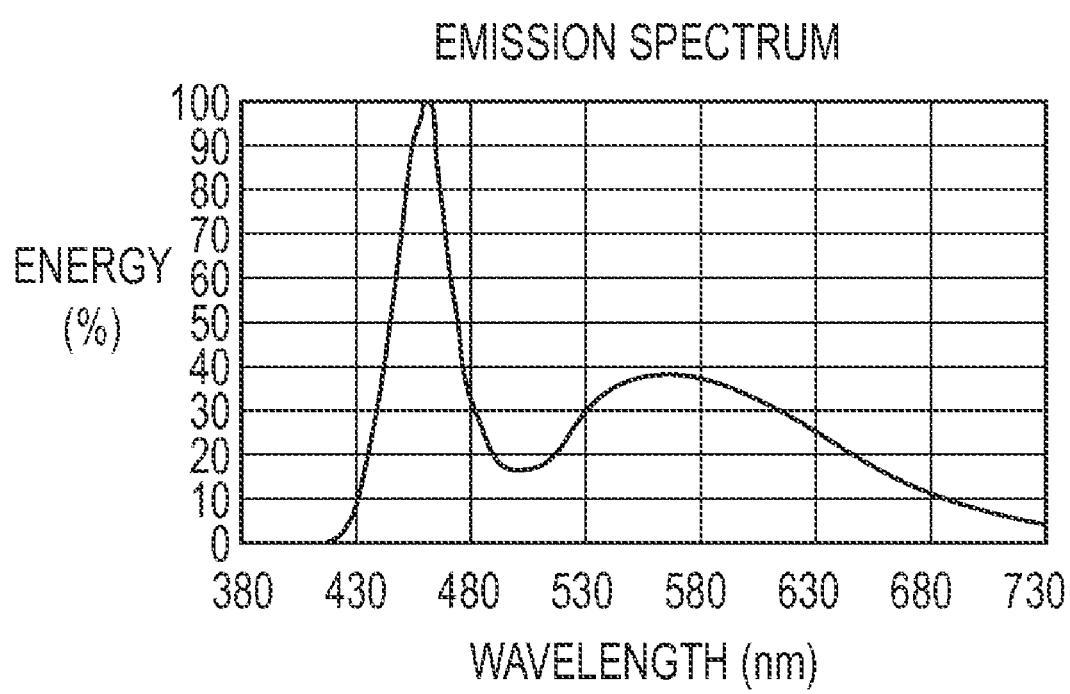
FIG. 2 is an exemplary emission spectrum for the output of the light emitting diode (LED) package of FIGS. 1A-1B.
Figure 3A:
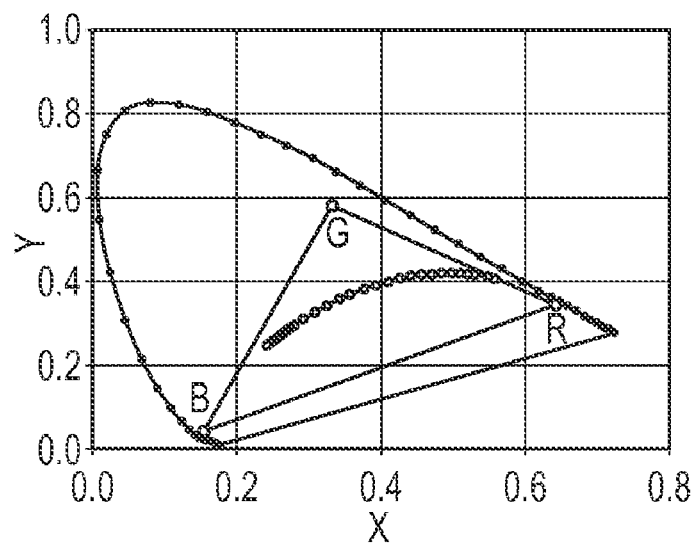
FIGS. 3A and 3B are a CIE chromaticity diagram and an emission spectrum, respectively, corresponding to an alternate light emitting diode (LED) package.
Figure 3B:
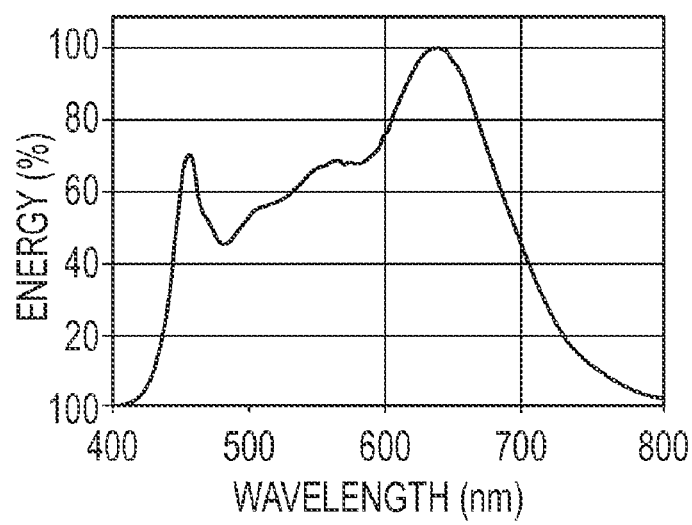
Figure 4A:
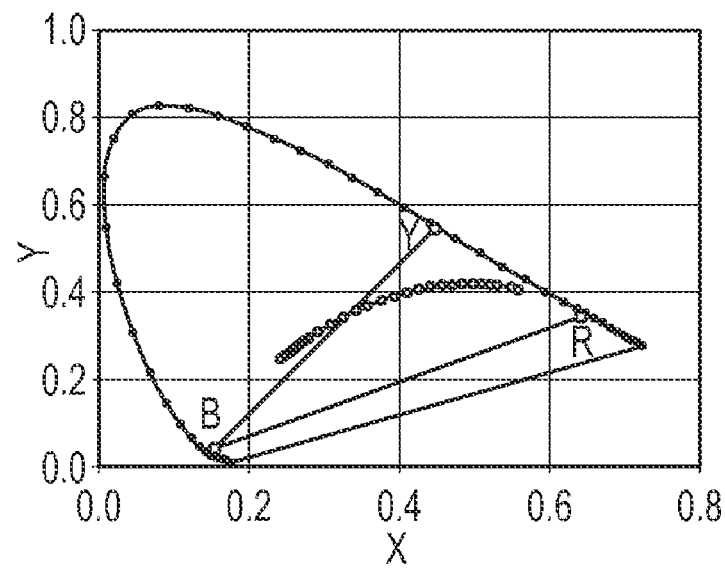
FIGS. 4A and 4B are a CIE chromaticity diagram and an emission spectrum, respectively, corresponding to another alternate light emitting diode (LED) package.
Figure 4B:
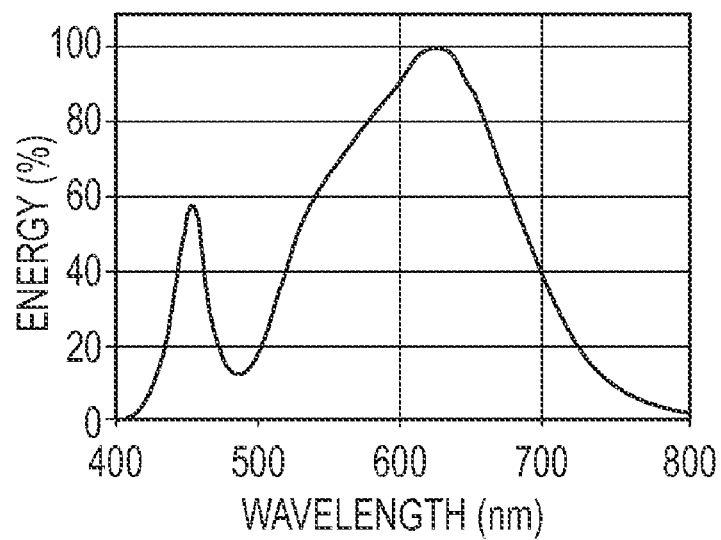
Figure 5A:
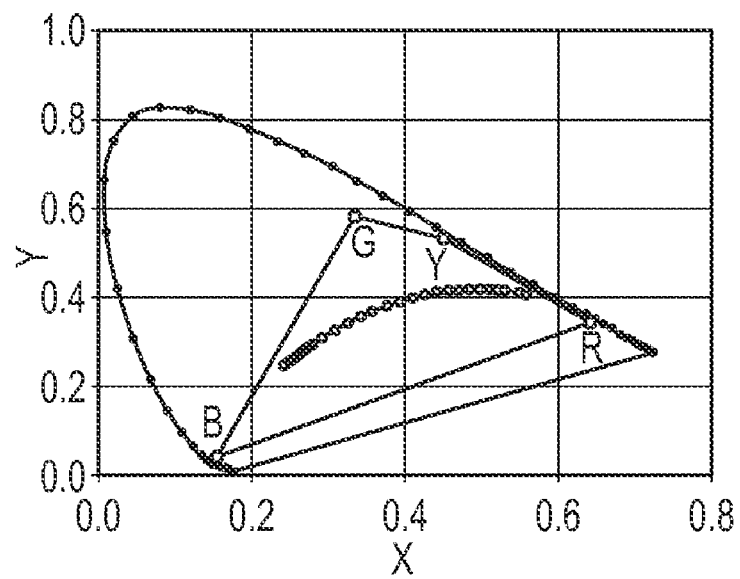
FIGS. 5A and 5B are a CIE chromaticity diagram and an emission spectrum, respectively, corresponding to another alternate light emitting diode (LED) package.
Figure 5B:
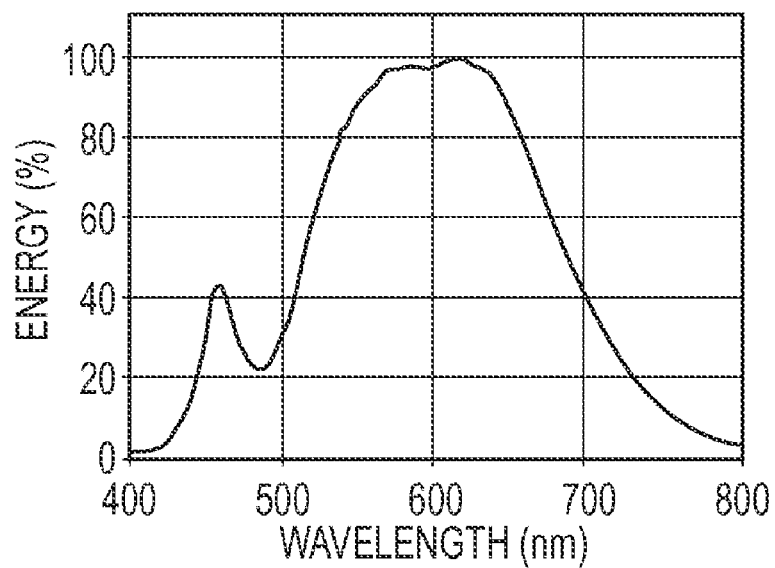

In addition, the wavelength conversion member 16 can comprise a single layer or multiple layers of material. U.S. Pat. No. 7,781,783 B2 to Yen et al., which is incorporated herein by reference, discloses different combinations for multiple wavelength conversion layers. For example, FIG. 2 shows an exemplary emission spectrum for white light from an (LED) die 14 configured to emit light in the blue spectral region in combination with a wavelength conversion member 16 configured to emit light in the yellow spectral region. FIGS. 3A and 3B are an International Commission on Illumination (Commission Internationale de l'Eclairage, or CIE) chromaticity diagram and an emission spectrum, respectively, corresponding to an LED package having a red fluorescent material in a first wavelength conversion layer and green a fluorescent material in a second wavelength conversion layer in combination with a blue LED die. FIGS. 4A and 4B are a CIE chromaticity diagram and an emission spectrum, respectively, corresponding to an LED package having a red fluorescent material in a first wavelength conversion layer and a yellow fluorescent material in a second wavelength conversion layer in combination with a blue LED die. FIGS. 5A and 5B are a CIE chromaticity diagram and an emission spectrum, respectively, corresponding to an LED package having a red fluorescent material in a first wavelength conversion layer and a yellow-green fluorescent material in a second wavelength conversion layer in combination with a blue LED die.

The transparent dome 20 (FIGS. 1A and 1B) functions as a lens that encapsulates the (LED) die 14. Suitable materials for the transparent dome 20 include silicone, epoxy and glass. The transparent dome 20 can comprise one or more layers of material formed using a suitable deposition process such as screen printing, dispensing, precise dispensing, spraying and jetting.

Figure 6A:
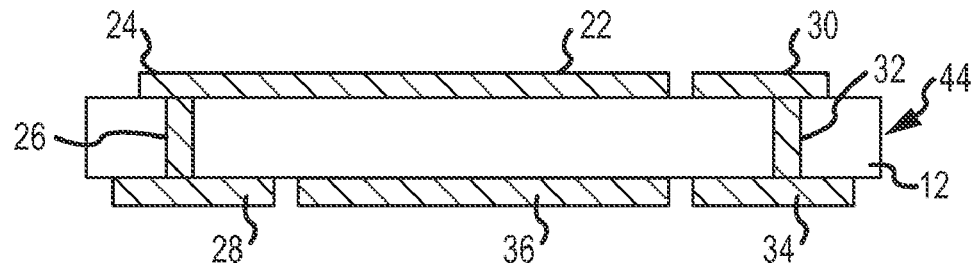
FIGS. 6A-6G are schematic cross sectional views illustrating steps in a method for fabricating the LED package of FIGS. 1A-1B.

Referring to FIGS. 6A-6G, steps in a method for fabricating the light emitting diode (LED) package 10 are illustrated. Initially, as shown in FIG. 6A, a wafer 44 comprised of a plurality of substrates 12 can be provided. For simplicity, only a single substrate 12 is illustrated. However, it is to be understood that the wafer 44 includes a plurality substrates 12 on which identical operations can be performed in a wafer level method, which decreases fabrication time and costs. The wafer 44 can comprise a conventional semiconductor wafer having a desired diameter and a desired thickness. Preferred materials for the wafer 44 include Si, $Al_2O_3$ and AlN. A representative thickness of the wafer 44 can be from 35 μm to 3000 μm.

The wafer 44 can include a plurality of identical metallization patterns on each substrate 12. Each substrate 12 includes the die-mounting pad 22, the front side conductor 24 in electrical communication with the die-mounting pad 22, the conductive via 26 in electrical communication with the front side conductor 24, and the back side electrode 28 in electrical communication with the conductive via 26. Each substrate 12 also includes the front side conductor 30, the conductive via 32 in electrical communication with the front side conductor 30, and the backside electrode 34 in electrical communication with the conductive via 32. The metallization patterns can be formed using well-known processes such as an additive process (deposition through a mask) or a subtractive process (etching through a mask). In addition, the front side conductors 24, 30 and the backside electrodes 28, 34 can be electrically separated as required by spaces. The conductive vias 26, 32 through the substrates 12 can also be formed using well know processes, such as by forming electrically insulated openings through the substrates 12, and filling the openings with a conductive material, such as a metal or conductive polymer.

Figure 6B:
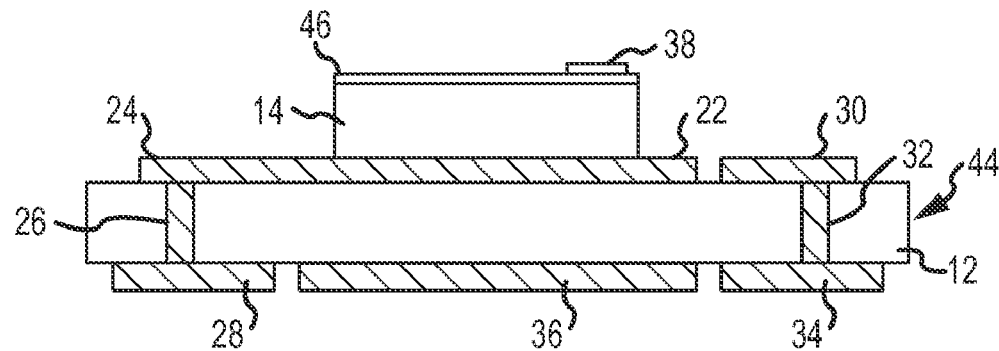

Next, as shown in FIG. 6B, a die mounting step can be performed to mount the light emitting diode (LED) dice 14 on the substrates 12 in electrical contact with the die mounting pads 22. For attaching the (LED) dice 14, bonding layers (not shown) can be formed using a solder reflow process, a bumping process or a silver epoxy curing process to bond the light emitting diode (LED) dice 14 to the die-mounting pads 22. The light emitting diode (LED) dice 14 can comprise conventional (LED) dice fabricated using known processes. For example, U.S. Pat. No. 7,723,718 B1 to Doan et al., which is incorporated herein by reference, describes representative processes for forming (LED) dice. Each (LED) die 14 can include an epitaxial stack 46 configured to emit electromagnetic radiation having desired characteristics, such as electromagnetic radiation in a desired spectral region. In addition, each (LED) die 14 can include the die contact 38 in electrical communication with the epitaxial stack 46 and a backside in electrical contact with the epitaxial stack 46. Suitable (LED) dice 14 are commercially available from SEMILEDS, INC. located in Boise, Id. and Miao-Li County, Taiwan, R.O.C.

Figure 6C:
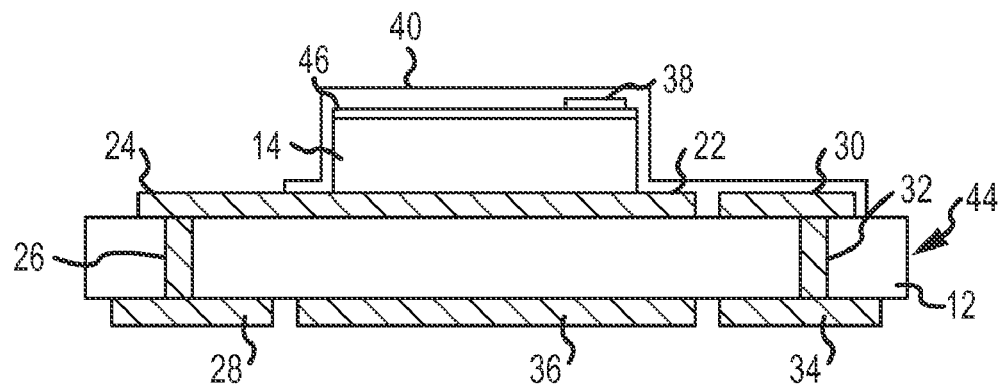
Figure 6D:
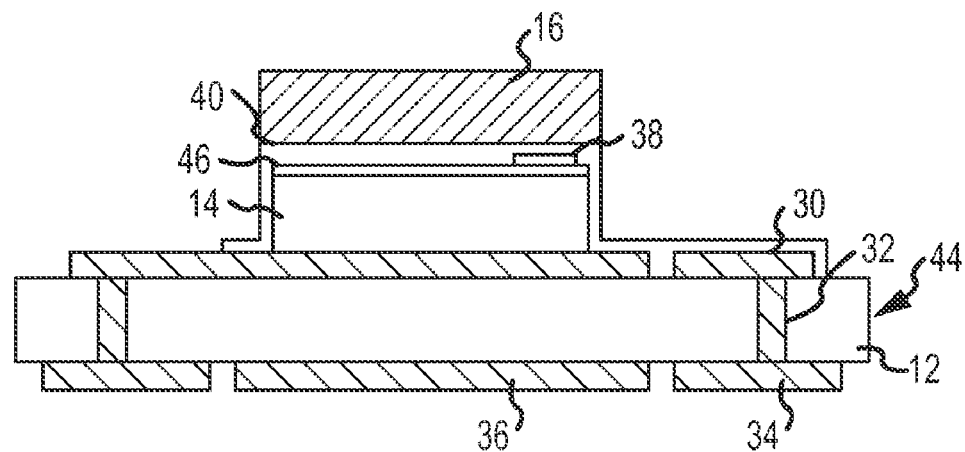

Next, as shown in FIG. 6C, a dielectric layer forming step can be performed to form the dielectric layers 40 on the circuit side and edges of the (LED) dice 14. The dielectric layers 40 also cover the die contacts 38, as well as portions of the die mounting pads 22, and the conductors 30. Preferred materials for the dielectric layer 40 include polymers such as silicone, epoxy and polymer adhesives. The dielectric layer 40 can be deposited using a suitable process such as spinning, precise dispensing, precise stamping, precise jetting, spraying, dispensing or screen-printing, followed by curing.

Next, as shown in FIG. 6C, a forming step can be performed to form the wavelength conversion members 16 on the dielectric layers 40 in alignment with the (LED) dice 14. Each wavelength conversion member 16 can comprise a sheet formed of a base material containing a wavelength conversion material that is attached to a corresponding dielectric layer 40 using a polymer adhesive. For example, a wavelength conversion material can be incorporated into a base material, such as plastic, glass or adhesive polymer, using a mixing process to form a viscous mixture, which can then be cured into solid form. Exemplary base materials include silicone and epoxy in liquid or viscous form, which can be mixed with the wavelength conversion material in a specific ratio. The mixture can then be applied to a release film using a coating process such as dip coating, rod coating, blade coating, knife coating, air knife coating, Gravure coating, roll coating or slot and extrusion coating. Further, the wavelength conversion member 16 can comprise a single layer or multiple layers formed using multiple coating processes. Exemplary coating processes are further described in Chapter 1 (pages 1-20) of Modern Coating And Drying Technology, by Edward D. Cohen, entitled "Choosing The Coating Method", which is incorporated herein by reference. An exemplary release film comprises a fluoropolymer resin manufactured by AGC Chemicals Americas, Inc. under the trademark FLUON. Following a curing process to solidify the mixture, the wavelength conversion member 16 in sheet form can be separated from the release film using a suitable process such as peeling. These sheets can then be cut in a peripheral shape matching the footprint of the (LED) dice 14 and attached using a polymer adhesive.

Rather than being in sheet form, the wavelength conversion members 16 can be formed on transparent bases, such as a plastic, glass or adhesive polymer plates or lens, using a suitable process such as spraying, dipping, spin coating, rolling, electro deposition or vapor deposition to a desired thickness. The wavelength conversion members 16 can also be deposited directly on the (LED) dice 14 using a suitable process such as precise dispensing, precise stamping, precise jetting, spraying, dispensing and screen printing followed by curing.

Figure 6E:
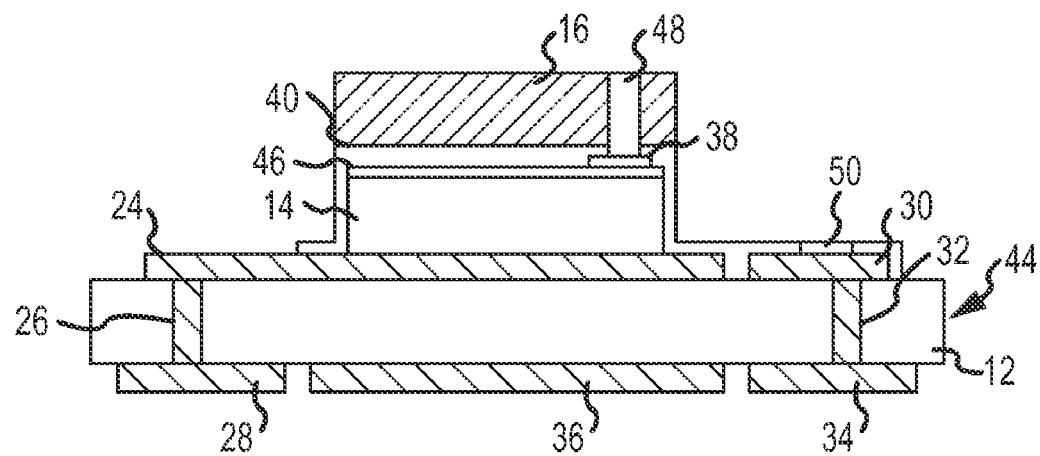

Next, as shown in FIG. 6E, a via forming step can be performed to form through vias 48 in the wavelength conversion members 16 to the die contacts 38, and through vias 50 through the dielectric layers 40 to the front side conductors 30. The via forming step can be performed using a suitable process such as $CO_2$ laser drilling or etching through a mask.

Figure 6F:
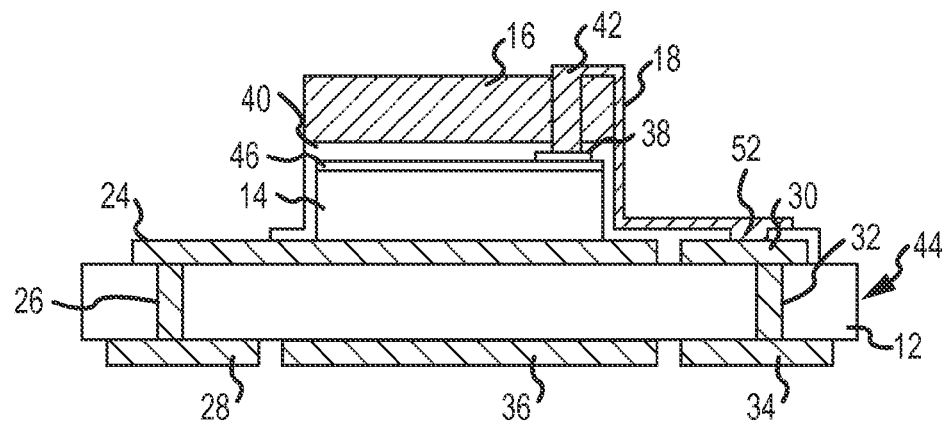

Next, as shown in FIG. 6F, a conductive via forming step can be performed to form the conductive vias 42 in the wavelength conversion members 16 in electrical contact with the die contacts 38, and the conductive vias 50 through the dielectric layers 40 to the conductors 30 on the substrates 12. As also shown in FIG. 6F, the interconnects 18 can be formed in electrical contact with the conductive vias 42, 52. This step can be performed by filling the openings 48, 50 (FIG. 6E) to form the conductive vias 42, 52 and forming the interconnects 18 as conductive traces in electrical contact with the conductive vias 42, 52, by depositing a conductive material, such as a metal or conductive polymer, or using a suitable deposition process (e.g., CVD through a mask or etching a blanket deposited layer) or a printing process (e.g., screen printing). As shown in FIG. 6F, each interconnect 18 extends along the front surface of the wavelength conversion member 16, then along the sidewalls of the wavelength conversion member 16, then along the sidewalls of the (LED) die 14, then along the front surface of the substrate 12. The dielectric layers 40 also extend along the sidewalls of the (LED) dice 14 and along the front surface of the substrate 12, which electrically insulates the interconnects 18 and prevents shorting.

Figure 6G:
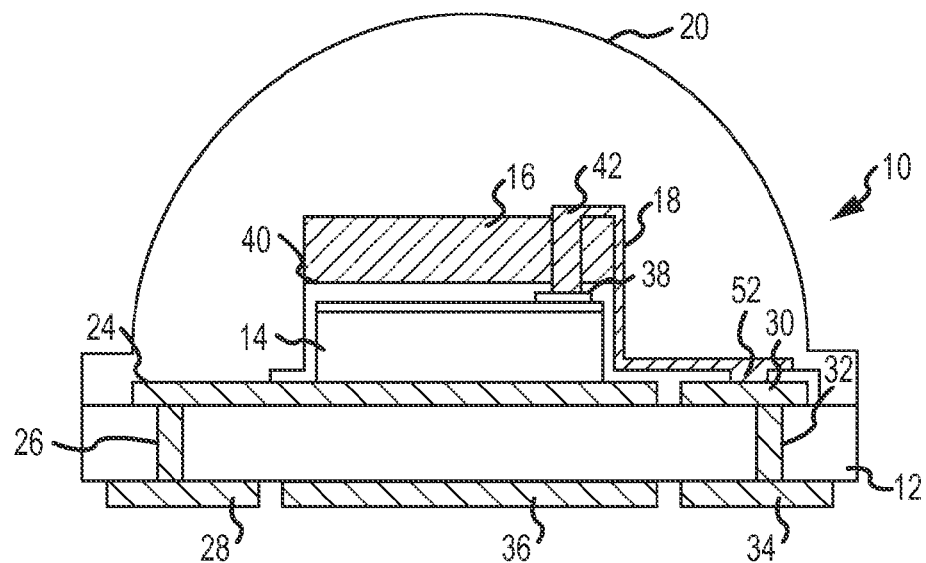

Next, as shown in FIG. 6G, a dispensing step can be performed to form the transparent domes 20 on the light emitting diode (LED) dice 14. The transparent domes 20 can comprise a transparent material, such as silicone, epoxy, polyimide, plastic or glass. The transparent domes 20 can be formed using a suitable deposition process such as screen printing, precise dispensing, stamping or jetting. Following the dispensing step the transparent domes can be cured using a suitable process such as heat curing or UV curing.

Following the dispensing step, a singulation step can be performed to singulate the wafer 44 into a plurality of light emitting diode (LED) packages 10. The singulation process is also referred to in the art as dicing. The singulation step can be performed using a process such as lasering, sawing, water jetting, etching or scribe and break, in which grooves (not shown) separate individual light emitting diode (LED) packages 10.

Thus the disclosure describes improved light emitting diode (LED) packages and method of fabrication. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A light emitting diode (LED) package comprising:
a substrate having a die-mounting pad, a first conductor in electrical communication with the die mounting pad and a second conductor;
a light emitting diode (LED) die in electrical contact with the die-mounting pad having a foot print, a circuit side, a die contact on the circuit side and a plurality of edges, the (LED) die configured to emit electromagnetic radiation in a first spectral region;
a dielectric layer on the circuit side and edges of the (LED) die and on the substrate;
a wavelength conversion member on the dielectric layer configured to convert the electromagnetic radiation in the first spectral region to electromagnetic radiation in a second spectral region, the wavelength conversion member having a peripheral shape substantially matching the footprint of the (LED) die, a front surface and sidewalls;
an interconnect comprising a conductive trace on the front surface of the wavelength conversion member and extending along a sidewall of the wavelength conversion member and on the dielectric layer on the edges of the (LED) die in electrical contact with the die contact and with the second conductor; and
a transparent dome configured as a lens encapsulating the (LED) die.

2. The (LED) package of claim 1 wherein the wavelength conversion member comprises a polymer sheet containing a wavelength conversion compound.

3. The (LED) package of claim 1 further comprising a first conductive via through the wavelength conversion member in electrical contact with the interconnect and a second conductive via through the dielectric layer in electrical contact with the interconnect.

4. The (LED) package of claim 1 further comprising a first electrode on a back side of the substrate in electrical contact with the first conductor, and a second electrode on a back side of the substrate in electrical contact with the second conductor.

5. The (LED) package of claim 1 wherein the light emitting diode (LED) die is configured to emit electromagnetic radiation in the blue spectral region, the wavelength conversion member is configured to convert the electromagnetic radiation to the yellow spectral region and an output of the (LED) package comprises white light.

6. The (LED) package of claim 1 wherein the wavelength conversion member comprises multiple layers including a red fluorescent material in a first wavelength conversion layer and green a fluorescent material in a second wavelength conversion layer.

7. The (LED) package of claim 1 wherein the wavelength conversion member comprises multiple layers including a red fluorescent material in a first wavelength conversion layer and a yellow fluorescent material in a second wavelength conversion layer.

8. The (LED) package of claim 1 wherein the wavelength conversion member comprises multiple layers including a red fluorescent material in a first wavelength conversion layer and a yellow-green fluorescent material in a second wavelength conversion layer.

9. A light emitting diode (LED) package comprising:
a substrate having a first side, a die-mounting pad on the first side, a first conductor on the first side in electrical communication with the die mounting pad and a second conductor on the first side;
a light emitting diode (LED) die in electrical contact with the die-mounting pad having a foot print, a circuit side, a die contact on the circuit side and a plurality of edges, the (LED) die configured to emit electromagnetic radiation in a first spectral region;
a dielectric layer on the circuit side and edges of the (LED) die and on the substrate;
a wavelength conversion member on the dielectric layer comprising a sheet containing a wavelength conversion compound configured to convert the electromagnetic radiation in the first spectral region to electromagnetic radiation in a second spectral region, the wavelength conversion member having a peripheral shape substantially matching the footprint of the (LED) die, a front surface and sidewalls;
an interconnect comprising a conductive trace on the front surface of the wavelength conversion member and extending along a sidewall of the wavelength conversion member and on the dielectric layer on the edges of the (LED) die in electrical contact with the die contact and with the second conductor;
a first conductive via comprising a first opening through the wavelength conversion member filled with a conductive material in electrical contact with the interconnect and a second conductive via comprising a second opening through the dielectric layer filled with the conductive material in electrical contact with the interconnect; and
a transparent dome configured as a lens encapsulating the (LED) die.

10. The (LED) package of claim 9 wherein the wavelength conversion member comprises a polymer sheet containing a phosphor compound.

11. The (LED) package of claim 9 further comprising a first conductive via in the substrate in electrical contact with the first conductor and a first electrode on a back side of the substrate in electrical contact with the first conductive via, and a second conductive via in the substrate in electrical contact with the second conductor and a second electrode on a back side of the substrate in electrical contact with the second conductive via.

12. The (LED) package of claim 9 wherein the light emitting diode (LED) die is configured to emit electromagnetic radiation in the blue spectral region, the wavelength conversion member is configured to convert the electromagnetic radiation to the yellow spectral region and an output of the (LED) package comprises white light.

13. The (LED) package of claim 9 wherein the conductive trace comprises the conductive material.

14. A method for fabricating a light emitting diode (LED) package comprising:

providing a substrate having a die mounting pad, a first conductor in electrical communication with the die mounting pad and a second conductor;

attaching a light emitting diode (LED) die to the substrate in electrical contact with the die mounting pad having a foot print, a circuit side, a die contact on the circuit side and a plurality of edges, the (LED) die configured to emit electromagnetic radiation in a first spectral region;

forming a dielectric layer on the circuit side and edges of the (LED) die and on the substrate;

forming a wavelength conversion member configured to convert the electromagnetic radiation in the first spectral region to electromagnetic radiation in a second spectral region, the wavelength conversion member having a peripheral shape substantially matching the footprint of the (LED) die, a front surface and sidewalls;

attaching the wavelength conversion member to the dielectric layer;

forming an interconnect comprising a conductive trace comprising a conductive material on the front surface of the wavelength conversion member and extending along sidewall of the wavelength conversion member and on the dielectric layer on the edges of the (LED) die having a first conductive via comprising a first opening in the wavelength conversion member filled with the conductive material in electrical contact with the die contact and a second conductive via comprising a second opening in the dielectric layer filled with the conductive material in electrical contact with the second conductor; and forming a transparent dome configured as a lens encapsulating the (LED) die.

15. The method of claim 14 wherein the forming the wavelength conversion layer step comprises mixing a wavelength conversion material with a base material to form a mixture, coating the mixture on a release film, curing the mixture and separating a wavelength conversion layer from the release film.

16. The method of claim 15 wherein the coating the mixture on the release film step comprise a process selected from the group consisting of dip coating, rod coating, blade coating, knife coating, air knife coating, Gravure coating, roll coating, and slot and extrusion coating.

17. The method of claim 14 wherein the wavelength conversion layer comprises a plastic, glass or adhesive polymer containing a phosphor compound.

18. The method of claim 14 wherein the (LED) die is configured to emit electromagnetic radiation in the blue spectral region, the wavelength conversion member is configured to convert the electromagnetic radiation to the yellow spectral region and an output of the LED package comprises white light.

19. The method of claim 14 wherein the wavelength conversion layer comprises multiple layers each configured to convert the electromagnetic radiation in the first spectral region to a different spectral region.

20. The method of claim 19 wherein the multiple layers include a red fluorescent material in a first wavelength conversion layer and green a fluorescent material in a second wavelength conversion layer.

21. The method of claim 19 wherein the multiple layers include a red fluorescent material in a first wavelength conversion layer and a yellow fluorescent material in a second wavelength conversion layer.

22. The method of claim 19 wherein the multiple layers include a red fluorescent material in a first wavelength conversion layer and a yellow-green fluorescent material in a second wavelength conversion layer.

* * * * *